United States Patent
Anthony

(12) 
(10) Patent No.: US 6,511,855 B2
(45) Date of Patent: *Jan. 28, 2003

(54) METHOD OF FORMING FERROMAGNETIC TUNNEL JUNCTIONS WITH ENHANCED MAGNETO-RESISTANCE

(75) Inventor: Thomas C. Anthony, Sunnyvale, CA (US)

(73) Assignee: Hewlett-Packard Company, Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/672,794

(22) Filed: Feb. 11, 2000

(65) Prior Publication Data

US 2002/0114972 A1 Aug. 22, 2002

Related U.S. Application Data

(62) Division of application No. 09/003,320, filed on Jan. 6, 1998, now Pat. No. 6,169,303.

(51) Int. Cl.[7] .......................... H01L 21/00; G11B 5/127
(52) U.S. Cl. ......................................... 438/3; 360/324.2
(58) Field of Search .......................... 438/3, 260, 263, 438/264, 910, 964, 965, 979, 981; 257/9, 10, 14, 17, 25, 30, 31, 317, 321; 204/192.2; 205/90; 360/324.2

(56) References Cited

U.S. PATENT DOCUMENTS

| | | | | |
|---|---|---|---|---|
| 3,375,091 A | * | 3/1968 | Feldtkeller | 428/621 |
| 4,806,202 A | * | 2/1989 | Tang et al. | 438/695 |
| 5,429,965 A | * | 7/1995 | Shimoji | 438/287 |
| 5,504,022 A | * | 4/1996 | Nakanishi et al. | 438/594 |
| 5,569,617 A | * | 10/1996 | Yeh et al. | 438/3 |
| 5,629,922 A | * | 5/1997 | Moodera et al. | 369/126 |
| 5,636,093 A | * | 6/1997 | Gijs et al. | 360/126 |
| 5,712,612 A | * | 1/1998 | Lee et al. | 338/32 R |
| 5,726,837 A | * | 3/1998 | Nakatani et al. | 360/113 |
| 5,731,598 A | * | 3/1998 | Kado et al. | 257/30 |
| 5,738,929 A | * | 4/1998 | Maeda et al. | 428/141 |
| 5,764,567 A | * | 6/1998 | Parkin | 365/173 |
| 5,768,181 A | * | 6/1998 | Zhu et al. | 365/158 |
| 5,879,783 A | * | 3/1999 | Chang et al. | 428/141 |
| 5,898,548 A | * | 4/1999 | Dill et al. | 360/324.2 |
| 5,966,012 A | * | 10/1999 | Parkin | 324/252 |
| 5,985,471 A | * | 11/1999 | Sato et al. | 428/692 |

* cited by examiner

Primary Examiner—Matthew Smith
Assistant Examiner—Lex H. Malsawma

(57) ABSTRACT

A tunnel junction having a topography and/or interface layers that enhance its magneto-resistance. The topography of the tunnel junction maximizes spin tunneling from areas of ferromagnetic crystalline grains having high polarization and minimizes the effects of defect scattering at grain boundaries. The interface layers enhance magnetic polarization properties of ferromagnetic layers near interfaces to an insulating layer in a tunnel junction.

11 Claims, 2 Drawing Sheets

METHOD OF FORMING FERROMAGNETIC TUNNEL JUNCTIONS WITH ENHANCED MAGNETO-RESISTANCE

CROSS REFERENCE TO RELATED APPLICATION(S)

This is a divisional of application Ser. No. 09/003,320 filed on Jan. 6, 1998, now U.S. Pat. No. 6,169,303.

BACKGROUND OF THE INVENTION

1. Field of Invention

The present invention pertains to the field of ferromagnetic tunnel junctions. More particularly, this invention relates to ferromagnetic tunnel junctions having enhanced magneto-resistance.

2. Art Background

Ferromagnetic tunnel junctions may be employed in a variety of magnetic systems. For example, a ferromagnetic tunnel junction may be employed as a magnetic flux sensor. Such a magnetic flux sensor is useful in a recording head for sensing the magnetic flux emanating from a magnetic media such as a tape or disk. In addition, ferromagnetic tunnel junctions may be employed as the magnetic storage cells in a magnetic memory.

Prior ferromagnetic tunnel junctions are usually formed with a pair of ferromagnetic layers separated by a thin insulating layer. Typically, an electrical potential bias applied to the ferromagnetic layers causes the migration of electrons between the ferromagnetic layers through the insulating layer. The phenomenon that causes the migration of electrons through the insulating layer may be referred to as quantum mechanical tunneling or spin tunneling.

Typically, the resistance of a ferromagnetic tunnel junction varies according to the relative orientations of magnetic moments in the ferromagnetic layers. A tunnel junction is usually in a low resistance state when the relative orientations of magnetization are parallel. Conversely, a tunnel junction is usually in a high resistance state when the relative orientations are anti-parallel.

A useful metric for characterizing a tunnel junction is its tunneling magneto-resistance (TMR). The TMR for a tunnel junction may be defined as its resistance in the high resistance state minus its resistance in the low resistance state divided by its resistance in the low resistance state. The TMR indicates a percentage change between the high and low resistance state of a tunnel junction.

It is usually desirable to employ tunnel junctions with relatively high TMRs. For example, a magnetic memory cell having a tunnel junction with a relatively high TMR usually provides increased signal-to-noise ratio during read operations in comparison to a magnetic memory cell having a tunnel junction with a relatively low TMR. In addition, a magnetic recording head having a tunnel junction with a relatively high TMR typically yields increased sensitivity in comparison to a magnetic recording head having a tunnel junction with a low TMR.

SUMMARY OF THE INVENTION

Ferromagnetic tunnel junctions with enhanced magneto-resistance are disclosed. An enhanced magneto-resistance is realized in a tunnel junction having a topography that maximizes spin tunneling from areas of ferromagnetic crystalline grains having high polarization and minimizes the effects of defect scattering at grain boundaries. The topography of this tunnel junction includes a first ferromagnetic layer with domed areas and intervening low areas and an insulating layer having a substantially planar upper surface. The domed areas of the first ferromagnetic layer combined with the planar upper surface of the insulating layer provide a path for electron migration between the first ferromagnetic layer and a second magnetic layer that is less above the domed areas than above the low areas. This tunnel junction structure minimizes the contribution to tunneling current from grain boundaries, i.e. low areas, and increases contribution from domed areas. In addition, an enhanced magneto-resistance is realized in a tunnel junction having thin interface layers that enhance magnetic polarization properties of ferromagnetic materials near the interfaces to the insulating layer in the tunnel junction.

Other features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
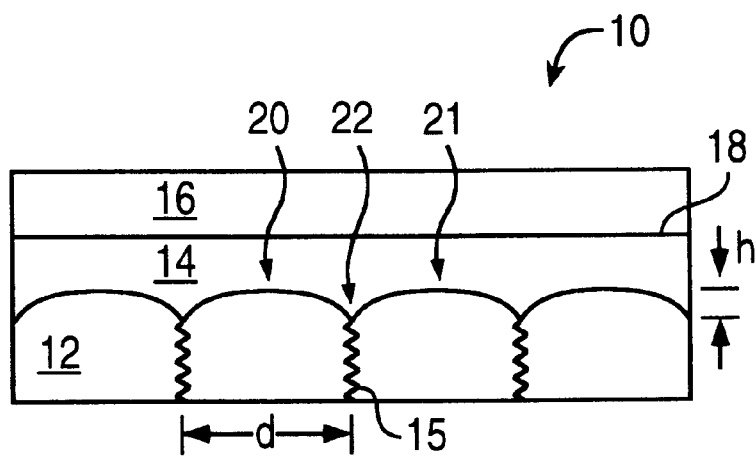
FIG. 1 illustrates a tunnel junction having a topography that enhances its tunneling magneto-resistance (TMR)

FIG. 1 illustrates one embodiment of a tunnel junction 10 having a topography that enhances its tunneling magneto-resistance (TMR). The tunnel junction 10 in this embodiment includes a ferromagnetic layer 12, an insulating layer 14, and a ferromagnetic layer 16.

The tunnel junction 10 provides a domed topography in the ferromagnetic layer 12 including a set of domed areas such as domed areas 20–21 and intervening low areas such as low area 22. The low areas correspond to grain boundaries in the poly-crystalline lattice structure of the ferromagnetic layer 12 such as a grain boundary 15 between the domed areas 20–21. The domed areas 20–21 are indicated having a dome diameter d and a dome height h. The tunnel junction 10 also provides a relatively planar topography of an upper surface 18 of the insulation layer 14.

The domed topography of the ferromagnetic layer 12 combined with the relatively planar upper surface 18 of the insulating layer 14 positions the domed areas 20–21 closer to the ferromagnetic layer 16 than the low area 22. As a consequence, the path for electrons migrating from the domed areas 20–21 to the ferromagnetic layer 16 is substantially less than the path for electrons migrating from the low area 22 to the ferromagnetic layer 16.

The domed areas 20–21 provide substantially all of the contribution to electron migration between the ferromagnetic layers 12 and 16 because electron migration through the insulating layer 14 reduces exponentially as the path increases. The contribution to electron migration from the low area 22 is minimized, which thereby minimizes the scattering effects that may occur at the grain boundaries in the poly-crystalline structure of the ferromagnetic layer 12.

In addition, the magnetic polarization in the ferromagnetic layer 12 may be higher at the domed areas 20–21 than at the low area 22 due to the higher degree of crystalline perfection at the domed areas 20–21. The topography of the tunnel junction 12 provides that the high polarization portions of the ferromagnetic layer 12 contribute to the tunneling current.

The ferromagnetic layers 12 and 16 are each formed of a layer of magnetic film such as nickel-iron. The insulating layer 14 in one embodiment is aluminum oxide which is formed in a manner that fills in the low area 22 and provides the relatively planar upper surface 18. In one embodiment, the insulating layer 14 is formed by depositing a layer of aluminum on to the ferromagnetic layer 12, which fills in the low areas, and then exposing it to an oxygen plasma.

Figure 2:
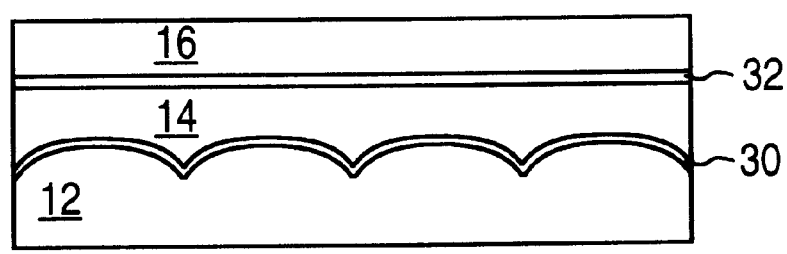
FIG. 2 illustrates a tunnel junction having a combination of topography and interface layers that enhance its tunneling magneto-resistance (TMR)

FIG. 2 illustrates an embodiment of the tunnel junction 10 that includes a pair of interface layers 30 and 32 that further enhance its tunneling magneto-resistance (TMR). The interface layers 30 and 32 are formed at the interfaces between the ferromagnetic layers 12 and 16 and the insulating layer 14. The interface layer 30 is formed between the ferromagnetic layer 12 and the insulating layer 14 and the interface layer 32 is formed between the insulating layer 14 and the ferromagnetic layer 16.

The interface layers 30–32 are selected to enhance the magnetic polarization properties of the ferromagnetic materials 12 and 16 near the interfaces to the insulating layer 14. The interface layers 30–32 are layers of ferromagnetic material such as nickel, iron, cobalt, or alloys of these elements.

The domed regions 20–21 that contribute to an elevated TMR value for the tunnel junction 10 may be described by the two dimensions shown of the dome diameter d and the dome height h (shown in FIG. 1). The grain diameter for polycrystalline films is equivalent to the dome diameter d.

A variety of methods well known in the art for controlling grain size may be applied to control the dome diameter d. Examples of such methods include the addition of seed layers, post-deposition annealing to facilitate grain growth, and control of deposition conditions, such as ambient pressure, film growth rate, film thickness, substrate bias, and substrate temperature. Many of these factors that control grain size also contribute to the control of the dome height h.

An additional factor that may contribute to the domed topography is anisotropic growth rate. For example, if the majority of grains of the ferromagnetic layer 12 are oriented such that their crystallographic orientation with respect to a substrate normal is the same, and that particular orientation provides a preferred growth rate over other crystallographic orientations, then faceted or domed grains may be generated that are taller in the center than at the grain boundaries.

Another mechanism for introducing surface topography in thin films is through stress, which can be created through the addition of lattice mismatched is seed layers or by adjusting deposition conditions. Compressive stress is favorable for creating domed topography.

Figure 3:
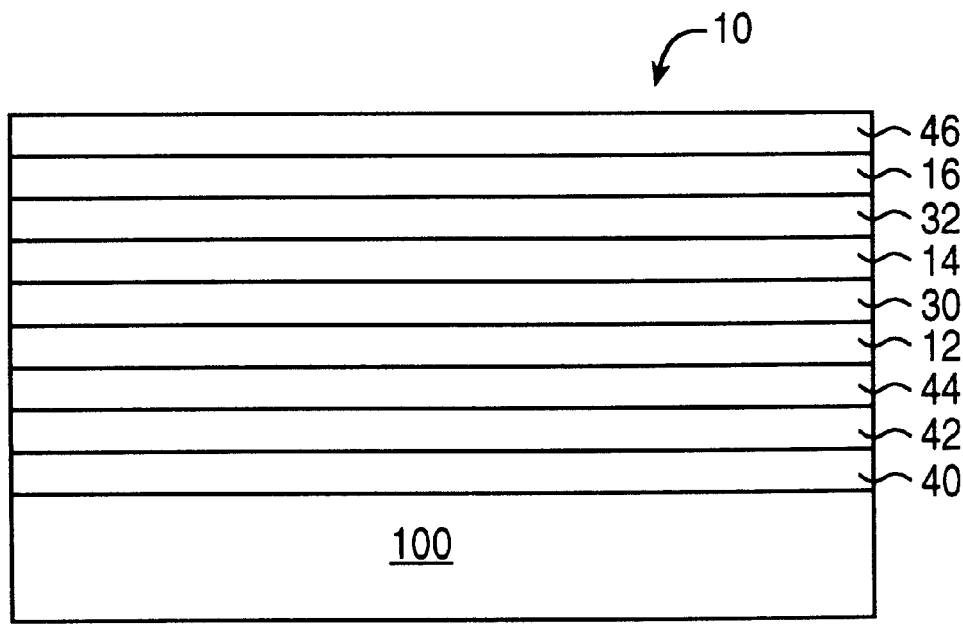
FIG. 3 illustrates an example series of process steps for forming the topography of a tunnel junction that enhances its TMR.

FIG. 3 illustrates an example series of process steps that enhance the TMR value of the tunnel junction 10. These steps include the formation of a domed topography and the insertion of high polarization interfacial layers in the tunnel junction 10.

The tunnel junction 10 is formed on a substrate 100 which may be oxidized silicon. Materials are deposited on the substrate 100 in a manner that facilitates the formation of the domed structures in the ferromagnetic layer 12.

In one embodiment, materials that facilitate the formation of the domed topography in the ferromagnetic layer 12 include a first seed layer 40, a second seed layer 42, and an antiferromagnetic layer 44. The first seed layer 40 in this embodiment is a material such as tantalum (Ta). The second seed layer 42 may be nickel-iron (NiFe). The antiferromagnetic material 44 may be iron manganese (FeMn). In this embodiment, the antiferromagnetic layer 44 provides a magnetic exchange film that pins the orientation of magnetization in the ferromagnetic layer 12.

The materials in the tunnel junction 10 may be deposited by sputtering in an argon ambient at a pressure of 5 milliTorr onto the substrate 100 which is held at room temperature and a ground potential. Film thickness is an important parameter in determining the diameter d and height h of the domed topography. In one embodiment, the first seed layer 40 is 10 nanometers thick, the second seed layer 42 is 6 nanometers thick, the antiferromagnetic layer 44 is 10 nanometers thick, and the ferromagnetic layer 12 is 12 nanometers which yields a cumulative thickness of polycrystalline materials beneath the insulating layer 14 of 38 nanometers. This thickness is sufficient to generate the domed topography in the ferromagnetic layer 12.

An interface layer 30 is then deposited over the domed topography of the ferromagnetic layer 12. The interface layer 30 conforms to the topography of the ferromagnetic layer 12. The insulating layer 14 is then formed by a deposition of aluminum that fills in the low areas 22 of the interface layer 30 and provides a planar upper surface. A subsequent oxidation step forms the aluminum oxide of the insulating layer 14. The interface layer 32 is then formed followed by the nickel-iron ferromagnetic layer 16. A cap layer 46 of material such as tantalum is formed over the ferromagnetic layer 16.

The interface layers 30–32 that further enhance the TMR value of the tunnel junction 10 may be formed from nickel, cobalt, or iron, or alloys of these elements. The following table shows the effects of example configurations of the interface layers 30–32 in the tunnel junction 10.

| Interface element | interface layer thickness | TMR (%) measured at 0.050 volts |
| --- | --- | --- |
| nickel | 1 nanometer | 20.0 |
| nickel | 0.5 nanometers | 24.2 |
| none | | 29.5 |
| iron | 0.25 nanometers | 35.1 |

In another embodiment, an ion etching step may be applied to either the ferromagnetic layer 12, the antiferromagnetic layer 44, or the seed layers 40 and 42 at some point prior to the formation of the insulating layer 14. The ion etching step is performed to remove preferentially portions of the etched layer in the vicinity of the grain boundaries such as the grain boundary 15 so as to create the low areas such as the low area 22. This etching step provides the dome topography that together with the planarized upper surface 18 of the insulating layer 14 yields enhanced magneto resistance in the tunnel junction 10.

The effect of the topography of the ferromagnetic layer 12 on the TMR value of the tunnel junction 10 may be characterized by comparing two structures, one with the domed topography described herein, and the other with a planar top surface of the ferromagnetic layer 12. In both cases the ferromagnetic layer 12 is nickel-iron, the insulating layer 14 is aluminum oxide formed through plasma oxidation of an aluminum film, and the ferromagnetic layer 16 is nickel-iron.

Referring to FIG. 3, comparison samples with planar top surfaces of the ferromagnetic layer 12 were prepared by moving the antiferromagnetic layer 44 from its position between layers 42 and 12 to a position between layers 16 and 46. The interfacial layers 30 and 32 were not included in these samples that examined the role of topography. Samples having planar interfaces on both sides of the insulator layer 14 had an average TMR of 23.6%. Samples with the domed topography described herein had an average TMR of 29.5%. Analysis of the planarity of the interfaces was made by high resolution transmission electron microscopy on cross-sectioned samples. The dome height h of the planar samples was less than 0.6 nanometers, and the dome height on the intentionally roughened samples was about 2.1 nanometers.

Figure 4:
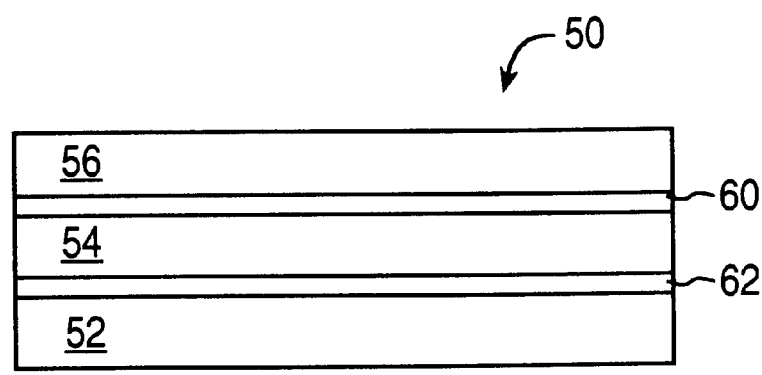
FIG. 4 illustrates a tunnel junction with interface layers that enhance its tunneling magneto-resistance (TMR).

FIG. 4 shows a tunnel junction 50 with a planar topography that includes a pair of interface layers 60 and 62 which enhance its TMR value. The tunnel junction 50 includes a ferromagnetic layer 52, an insulating layer 54, and a ferromagnetic layer 56 which may be formed on a substrate or on one or more intervening materials. The ferromagnetic layer 52 has a substantially planar upper surface without a bowed topology.

The interface layers 60 and 62 are thin layers of ferromagnetic materials which are selected to enhance the magnetic polarization properties of the ferromagnetic layers 52 and 56 near the interfaces to the insulating layer 54. In one embodiment, the interface layers 60 and 62 are thin layers of less than 4 nanometers thickness. The interface layers 60 and 62 may be nickel, iron, cobalt, or alloys of these elements.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A method for forming a tunnel junction, comprising the steps of:
    forming a first ferromagnetic layer with an upper surface having a topography which includes a set of domed areas and a set of intervening low areas;
    forming an insulating layer over the first ferromagnetic layer such that an upper surface of the insulating layer is substantially planar such that a path for electron migration between the first ferromagnetic layer and a second ferromagnetic layer in the tunnel junction is less above the domed areas than above the low areas.

2. The method of claim 1, wherein the step of forming a first ferromagnetic layer includes the step of forming one or more layers of materials below the first ferromagnetic layer wherein a thickness of the layers of materials is selected to cause formation of the domed areas during formation of the first ferromagnetic layer.

3. The method of claim 2, wherein the layers of materials provide a pinning layer that fixes an orientation of magnetization in the first ferromagnetic layer.

4. The method of claim 2, wherein the intervening low areas correspond to grain boundaries in a polycrystalline structure of the first ferromagnetic layer.

5. The method of claim 2, wherein one of the layers of materials is selected to provide a lattice mismatch with the first ferromagnetic layer.

6. The method of claim 1, further comprising the steps of forming an interface layer at an interface between the insulating layer and the first ferromagnetic layer.

7. The method of claim 6, further comprising the steps of forming an interface layer at an interface between the insulating layer and the second ferromagnetic layer.

8. The method of claim 7, wherein the interface layers are selected to enhance the magnetic polarization properties of the first and second ferromagnetic layers near the interfaces to the insulating layer.

9. A method for forming a tunnel junction, comprising the steps of:
    forming a first ferromagnetic layer with an upper surface having a topography which includes a set of domed areas and a set of intervening low areas;
    forming a first thin interface layer on the first ferromagnetic layer;
    forming an insulating layer on the first thin interface layer wherein the first thin interface layer enhances magnetic polarization properties of the first ferromagnetic layer near an interface between the first ferromagnetic layer and the insulating layer.

10. A method for forming a tunnel junction, comprising:
    forming a first ferromagnetic layer with an upper surface having a topography which includes a set of domed areas and a set of intervening low areas;
    forming a first thin interface layer on the first ferromagnetic layer;
    forming an insulating layer on the first thin interface layer,
    forming a second thin interface layer on the insulating layer; and
    forming a second ferromagnetic layer on the second thin interface layer;
    wherein the first thin interface layer enhances magnetic polarization properties of the first ferromagnetic layer near an interface between the first ferromagnetic layer and the insulating layer;
    wherein the second thin interface layer enhances magnetic polarization properties of the second ferromagnetic layer near an interface between the insulating layer and the second ferromagnetic layer.

11. The method of claim 10, wherein each interface layer is formed by forming a layer of ferromagnetic material less than 4 nanometers thick.

* * * * *